(12) United States Patent
Lee

(10) Patent No.: US 9,982,337 B2
(45) Date of Patent: May 29, 2018

(54) SPUTTERING METHOD USING SPUTTERING DEVICE

(71) Applicant: Hydis Technologies Co., Ltd., Icheon-si, Gyeonggi-do (KR)

(72) Inventor: Jai Chun Lee, Yongin-si (KR)

(73) Assignee: Hydis Technologies Co., Ltd., Icheon-si (KR)

( * ) Notice: Subject to any disclaimer, the term of this patent is extended or adjusted under 35 U.S.C. 154(b) by 218 days.

(21) Appl. No.: 14/932,005

(22) Filed: Nov. 4, 2015

(65) Prior Publication Data

US 2016/0053367 A1 Feb. 25, 2016

Related U.S. Application Data

(62) Division of application No. 13/660,263, filed on Oct. 25, 2012, now Pat. No. 9,206,503.

(30) Foreign Application Priority Data

Nov. 3, 2011 (KR) .................. 10-2011-0113937
Mar. 9, 2012 (KR) .................. 10-2012-0024395

(51) Int. Cl.
*C23C 14/00* (2006.01)
*C23C 14/35* (2006.01)
*H01J 37/34* (2006.01)

(52) U.S. Cl.
CPC .......... *C23C 14/35* (2013.01); *H01J 37/3455* (2013.01); *H01J 37/3408* (2013.01)

(58) Field of Classification Search
CPC .... C23C 14/35; H01J 37/3408; H01J 37/3455
USPC ................. 204/298.2, 298.02, 192.12
See application file for complete search history.

(56) References Cited

U.S. PATENT DOCUMENTS

| | | | |
|---|---|---|---|
| 5,873,989 A | 2/1999 | Hughes et al. | |
| 6,723,210 B2 | 4/2004 | Teng et al. | |
| 7,429,718 B2 | 9/2008 | Inagawa et al. | |
| 7,513,982 B2 | 4/2009 | Tepman | |
| 8,500,975 B2 | 8/2013 | Le et al. | |
| 2006/0049040 A1 | 3/2006 | Tepman | |
| 2007/0028842 A1 | 2/2007 | Inagawa et al. | |
| 2011/0195562 A1 | 8/2011 | Kurata et al. | |
| 2012/0024694 A1 | 2/2012 | Mullapudi et al. | |

OTHER PUBLICATIONS

Abstract of Japanese Patent—JP2000192239, Jul. 11, 2000, 2 pages.
(Continued)

*Primary Examiner* — Timon Wanga
(74) *Attorney, Agent, or Firm* — Dority & Manning, P.A.

(57) ABSTRACT

The present invention relates to a sputtering method using a sputtering device, wherein entire scan region is defined from one side to the other side of a sputtering target, and the sputtering target is scanned with a magnet moving back and forth along the entire scan region multiple times. The entire scan region of a sputtering target is divided by N parts to be uniformly eroded, such that a magnet moves back and forth along some part of the divided entire scan region. A sputtering method using a sputtering device can therefore extend an alternating cycle of a sputtering target, by virtue of improving utilization efficiency of the sputtering target through uniform erosion of the sputtering target, and can also reduce manufacturing cost.

8 Claims, 15 Drawing Sheets

(56) References Cited

OTHER PUBLICATIONS

Abstract of Japanese Patent—JP2008081805, Apr. 10, 2008, 2 pages.
Abstract of Japanese Patent—JP2009046730, Mar. 5, 2009, 2 pages.
Abstract of Korean Patent—KR20080047709, May 30, 2008, 1 page.
Abstract of Korean Patent—KR20090105419, Oct. 7, 2009, 1 page.
Abstract of Japanese Patent—JP2004315932, Nov. 11, 2004, 2 pages.
Abstract of Japanese Patent—JP2000104167, Apr. 11, 2011, 2 pages.

SPUTTERING METHOD USING SPUTTERING DEVICE

CROSS REFERENCE TO RELATED APPLICATIONS

This application is a divisional of U.S. application Ser. No. 13/660,263, filed on Oct. 25, 2012, which claims priority to and the benefit of Korean Patent Application No. 10-2011-0113937 filed in the Korean Intellectual Property Office on Nov. 3, 2011 and Korean Patent Application No. 10-2012-0024395 filed in the Korean Intellectual Property Office on Mar. 9, 2012, the entire contents of which are incorporated herein by reference.

BACKGROUND OF THE INVENTION (a) Technical Field

The present invention relates to a sputtering method using a sputtering device, and more particularly to a sputtering method using a sputtering device, wherein scan region of a magnet, which scans the undersurface of a sputtering target is defined as some part of the divided entire scan region of sputtering target and is applied in sequential order.

(b) Description of the Related Art

Generally, a sputtering device is widely used in forming thin films on substrates for semiconductor elements or substrates for Liquid Crystal Display devices.

FIG. 1 is an overview of a sputtering device. Referring to FIG. 1, the sputtering device is characterized by comprising a suscepter 102, in which a substrate 103 is installed within a vacuum chamber 101, a metal sputtering target 104, which is employed as deposition source on the opposite surface of the substrate 103.

The sputtering target 104 herein is fixed by a back plate 105 to provide materials for thin films to be formed on the substrate 103, a ground shield 106 is prepared along the side of the sputtering target 104, a mask 107 is prepared along the periphery of a gap between the substrate 103 and the sputtering target 104.

A magnet 108 to allow DC power is attached to the undersurface of the back plate 105 by a driving means 109, such that the magnet can scan back and forth the sputtering target 104.

In such a state, if inert gas argon (Ar) is supplied into the vacuum chamber 101, and DC bias is powered to the sputtering target 104, the inert gas is transformed to a state of ionized plasma, which leads to ions colliding with the sputtering target 104, and thin films are formed on the substrate 103, with the sputtering target 104 emitting atoms.

At this point, the magnet 108 provides magnetic field by scanning back and forth the sputtering target 104, as shown in FIG. 2, thereby, inducing the ions to collide with the sputtering target 104.

Conventionally, however, in a scanning motion of the magnet 108, scanning speed is supposed to decrease at left side and right side of the sputtering target 104, allowing the magnet to stay at left side and right side relatively longer than at center part. If the magnet 108 is in a stationary state for long, the duration of exposure to the magnetic field gets longer at left side and right side than at center part of the scan region D of the magnet 108.

Namely, erosion occurs relatively more at the left side and the right side where the duration of exposure of the magnet 108 of the sputtering target 103 gets relatively long than at the center.

FIG. 3 is a cross-section view along I-I' line in FIG. 2. Referring to FIG. 3, it may be observed in sputtering target A that the thickness $t_3$ at either side is smaller than the thickness $t_2$ at the center part, which means the either side have been eroded more than the center part.

Consequently, the utilization efficiency of the sputtering target of a sputtering device is lessened because erosion is concentrated on left side and right side than on center part.

In addition, a changing term of a sputtering target gets faster depending on the lessened utilization efficiency.

Furthermore, as the changing term of the sputtering target gets faster, manufacturing cost of forming thin film on substrate would correspondingly increase.

SUMMARY OF THE INVENTION

A sputtering method using a sputtering device, which may extend a changing term of a sputtering target, by virtue of improving utilization efficiency of the sputtering target through uniform erosion of the sputtering target of the sputtering device is provided.

Likewise, it is intended to provide in the invention the sputtering method using the sputtering device, which could reduce manufacturing cost by extending the changing term of the sputtering target.

An exemplary embodiment of the present invention provides a sputtering method using a sputtering device, wherein entire scan region is defined from one side to the other side of a sputtering target, and the sputtering target is scanned with a magnet moving a magnet back and forth along the entire scan region multiple times, including: original scanning step, wherein the entire scan region is divided into N (N≥4, wherein n is an integer) parts from the left side to the other side of the sputtering target along with scan direction, and original scan region is defined from the Pth ($1 \leq P \leq N/2$, wherein p is an integer) part to the (N−P+1)th part as start part and end part respectively, with the magnet scanning back and forth the original scan region at least once; and altered scanning step, wherein altered scan region is defined from the Qth ($1 \leq Q \leq N/2$, $Q \neq P$, wherein Q is an integer) part to the (N−Q+1)th part as start part and end part respectively, with the magnet scanning back and forth the altered scan region at least once after the original scanning step, and the altered scanning step is conducted at least once. It is desirable herein that the Q be P−1 or P+1 in the altered scanning step.

At this point, in case of conducting the altered scanning step more than twice, each start part of the altered scan region is preferably set up differently from each other.

Moreover, in accordance with another exemplary embodiment of the invention, a sputtering method using a sputtering device comprises steps of: defining the entire scan region, which is divided by N (N is a positive integer) parts; defining multiple forward scan regions and multiple backward scan regions, which are arranged to comprise at least some part of the divided entire scan region; defining scan cycle 1 and scan cycle 2, which are arranged by combinations of several multiple forward scan regions and several multiple backward scan regions respectively, wherein the scan cycle 1 is arranged in the manner that the first forward scan region is defined from the 1st part out of the N parts to the Pth part out of the N parts as start part and end part respectively, and the Ath forward scan region is defined from the Ath part out of the N parts to the (P+A−1)th part out of the N parts as start part and end part respectively ($1 \leq A \leq (N/2)$, $((N/2)+1) \leq P < N$, $(P+A-1) \leq N$, wherein A and P are integers); arranging multiple forward scan regions of the scan cycle 2, in the reverse order to the multiple forward scan regions arranged in the scan cycle 1; and defining the multiple backward scan regions arranged in the scan cycle 1 and the scan cycle 2 respectively in the manner that the end part of the previous forward scan region is start part and the start part of the subsequent forward scan region is end part respectively, such that a magnet has a continuous motion, and the scan cycle 1 and the scan cycle 2 are alternately arranged appearing at least once respectively, such that the magnet moves according to the scan cycle 1 and the scan cycle 2.

In addition, in accordance with another exemplary embodiment of the invention, a sputtering method of using a sputtering device comprises steps of: defining the entire scan region, which is divided by N (N is a positive integer) parts; defining multiple forward scan regions and multiple backward scan regions, which are alternately arranged to comprise at least some part of the divided entire scan region; defining scan cycle 1 and scan cycle 2, which are arranged by combinations of several multiple forward scan regions and several multiple backward scan regions respectively, wherein the scan cycle 1 is arranged in the manner that the first forward scan region is defined from the 1st part out of the N parts to the Pth part out of the N parts as start part and end part respectively, and the Ath forward scan region is defined from the Ath part out of the N parts to the (N−A+1)th part out of the N parts as start part and end part respectively (A≤(N/2) if N is an even number, A≤(N−1)/2 if N is an odd number, 1≤A≤(N/2), wherein A is an integer); arranging multiple forward scan regions of the scan cycle 2, in the reverse order to the multiple forward scan regions arranged in the scan cycle 1; and defining the multiple backward scan regions arranged in the scan cycle 1 and the scan cycle 2 respectively in the manner that the end part of the previous forward scan region is start part, and the start part of the subsequent forward scan region is end part, such that a magnet has a continuous motion, and the scan cycle 1 and the scan cycle 2 are alternately arranged at least appearing once respectively, such that the magnet moves according to the scan cycle 1 and the scan cycle 2.

At this point, when alternately arranging the scan cycle 1 and the scan cycle 2, a backward scan region after the last forward scan region of a scan cycle is arranged in the manner that the end part of the last forward scan region of the scan cycle is set up as start part of the backward scan region, and the start part of the first forward scan region of the next scan cycle is set up as end part of the backward scan region.

On the other hand, the individual width of the N parts is set up substantially the same to each other, as well as each width of the N parts is set up substantially the same to the width of the sputtering target.

According to the present invention, a sputtering method using a sputtering device is provided which may extend an alternating cycle of the sputtering target by improving utilization efficiency of a sputtering target of the sputtering device.

Also, a sputtering method using a sputtering device is provided which may reduce manufacturing cost by extending the alternating cycle of the sputtering target.

DETAILED DESCRIPTION OF THE EXEMPLARY EMBODIMENTS

Figure 1:
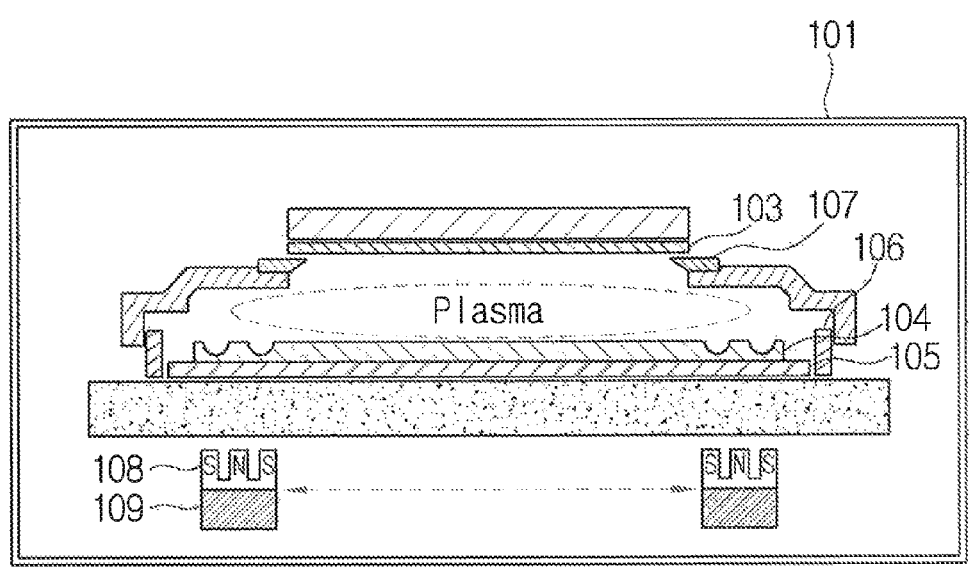
FIG. 1 is an overview of a sputtering device.
Figure 2:
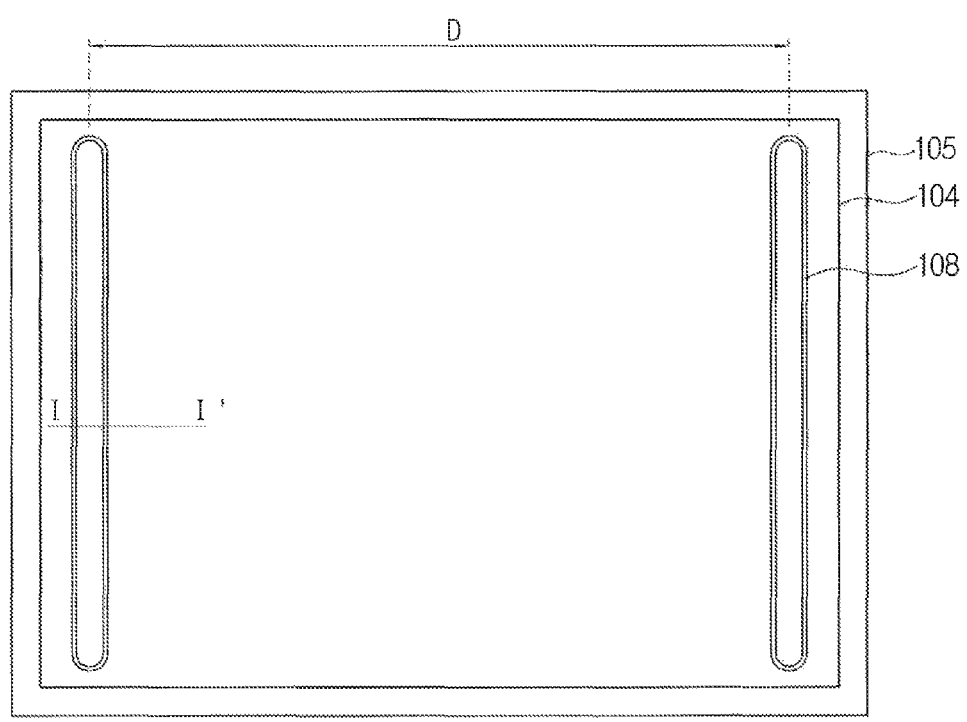
FIG. 2 is a top view of a sputtering target and a magnet employed in a conventional sputtering method.
Figure 3:
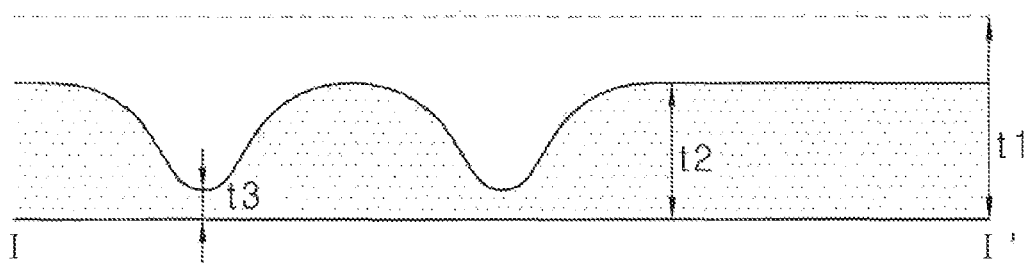
FIG. 3 is a cross-section view along I-I′ line of FIG. 2, FIGS. 4 and 5 are a top view of a sputtering target and a magnet employed in a sputtering method using a sputtering device according to the present invention.

Prior to description, elements will be representatively explained in first exemplary embodiment, in which like reference numerals refer to like elements throughout, and different configurations to those of first exemplary embodiment will be described in other exemplary embodiments.

A sputtering method using a sputtering device in accordance with first exemplary embodiment of the present invention is described in greater detail below, referring to accompanying drawings.

The sputtering device employed in this exemplary embodiment may be substantially the same as that of a conventional method. Also, a sputtering target employed herein employs a target formed in a linear frame as in the conventional method.

Figure 4:
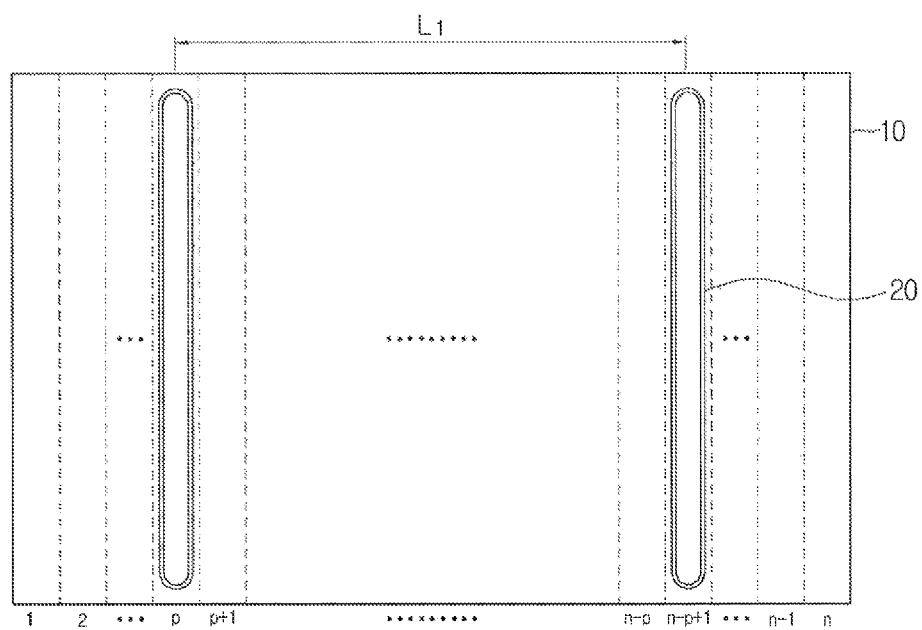
Figure 5:
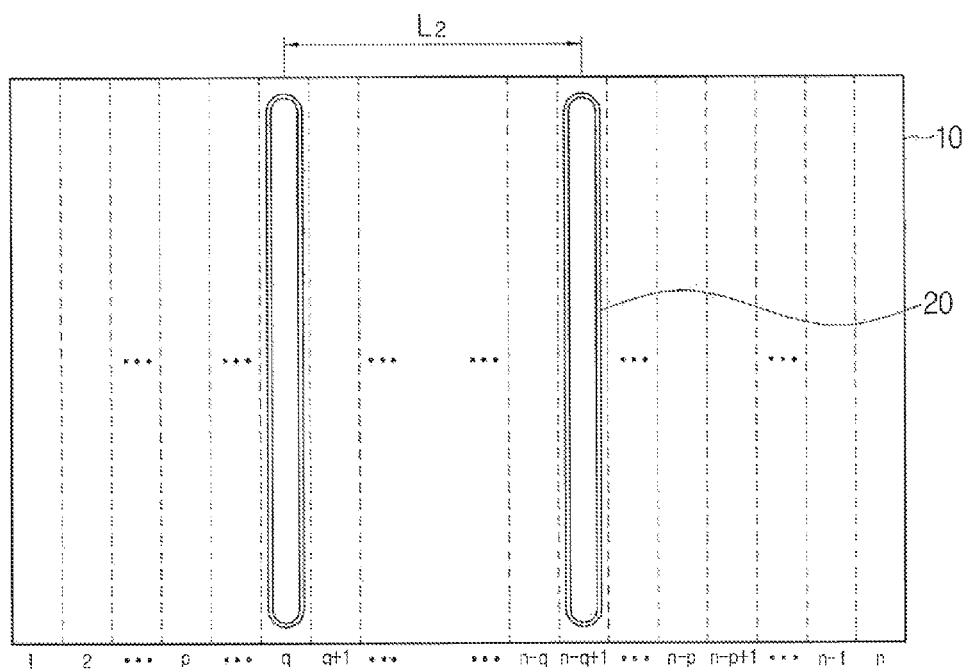

FIGS. 4 and 5 are a top view diagram of a sputtering target and a magnet employed in a sputtering method using a sputtering device according to first exemplary embodiment of the present invention.

First, in a sputtering method using a sputtering device in accordance with first exemplary embodiment of the invention, referring to FIG. 4, entire scan region is divided into N parts from left side to right side of the sputtering target 10, along which a magnet scans back and forth. N herein is a positive integer.

Although conventional entire scan region is defined from left side to right side in order to maximize utilization efficiency of the sputtering target 10, some part of the sputtering target 10 may be set up as the entire scan region as necessary.

Each width of the divided parts is prepared substantially the same as each other, and preferably, each width of the divided parts is prepared substantially the same to that of a magnet 20.

If each width of the divided parts is prepared substantially the same to that of the magnet 20, over-erosion by the magnet at both sides where erosion is concentrated on would cease, thus avoiding severe erosion on both ends.

Subsequently, after original scan region $L_1$ is defined from the Pth (1≤P≤N/2, wherein P is an integer) part to the (N−P+1)th part as start part and end part respectively, the magnet 20 scans back and forth the original scan region $L_1$ of the sputtering target at least once for a certain period of time. The certain period of time herein may be predetermined.

After scanning the original scan region $L_1$ for the certain period of time, referring to FIG. 5, the magnet scans back and forth the altered scan region $L_2$ at least once for a certain period of time, which is defined from the Qth ($1 \leq Q \leq N/2$, $Q \neq P$, wherein Q is an integer) part to the (N−Q+1)th part as start part and end part respectively. Preferably, Q herein is (P−1) or (P+1).

Namely, it is desirable that the start point in the altered scanning step be chosen at the closest side of the magnet to the start part in the original scanning step to maximize utilization efficiency.

When carrying out the altered scan step more than twice, it is desirable that the start part of the second cycle of the altered scan region is different from the start part of the first cycle of the altered scan region, and the end part of the second cycle of the altered scan region is different from the end part of the first cycle of the altered scan region.

A sputtering method using a sputtering device as described above is set forth with the aid of detailed example below.

Example 1

Figure 6:
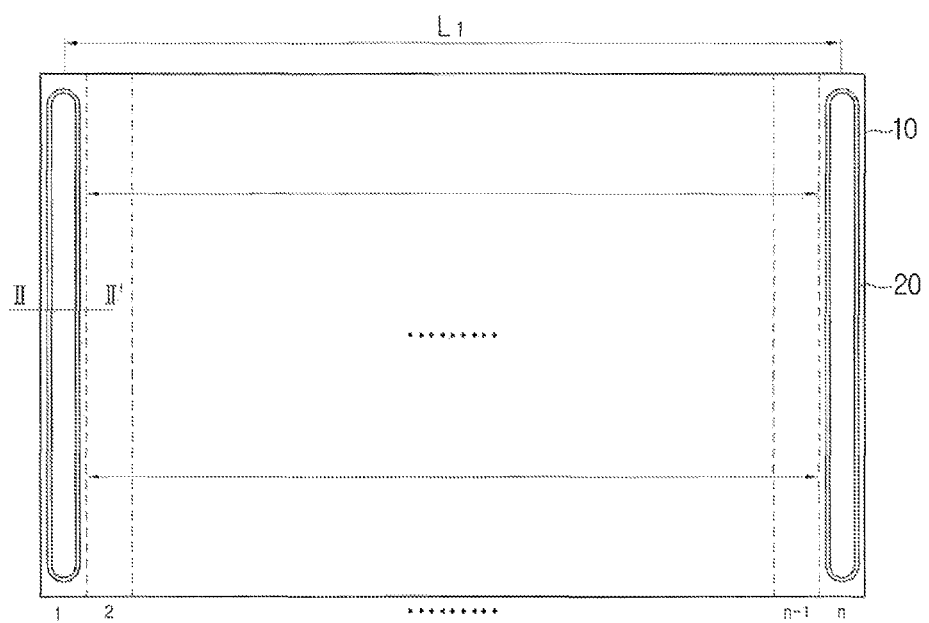
FIGS. 6-13 are a state diagram of a sputtering target according to exemplary embodiments of a sputtering method using a sputtering device of the present invention.

Assuming that P=1, Q=2, and altered scan region is scanned once, original scan region $L_1$ is defined from the 1st part to the Nth part as start part and end part, since P=1 as indicated in FIG. 6. Likewise, altered scan region $L_2$ is defined from the 2nd part to the (N−1)th part as start part and end part, since Q=2 as shown in FIG. 8.

In this configuration, as shown in FIG. 6, a magnet scans the original scan region $L_1$ which is defined from the 1st part to the Nth part of the sputtering target 10 at least once for a certain period of time.

Figure 7:
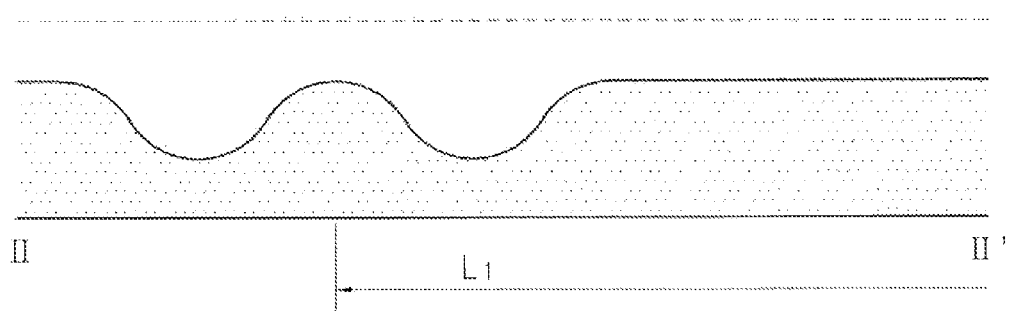

FIG. 7 is a cross-section view along II-II' line of FIG. 6. Referring to FIG. 7, if the original scan region $L_1$ is scanned for a certain period of time, erosion occurs concentrated on the 1st part and the Nth part.

Figure 8:
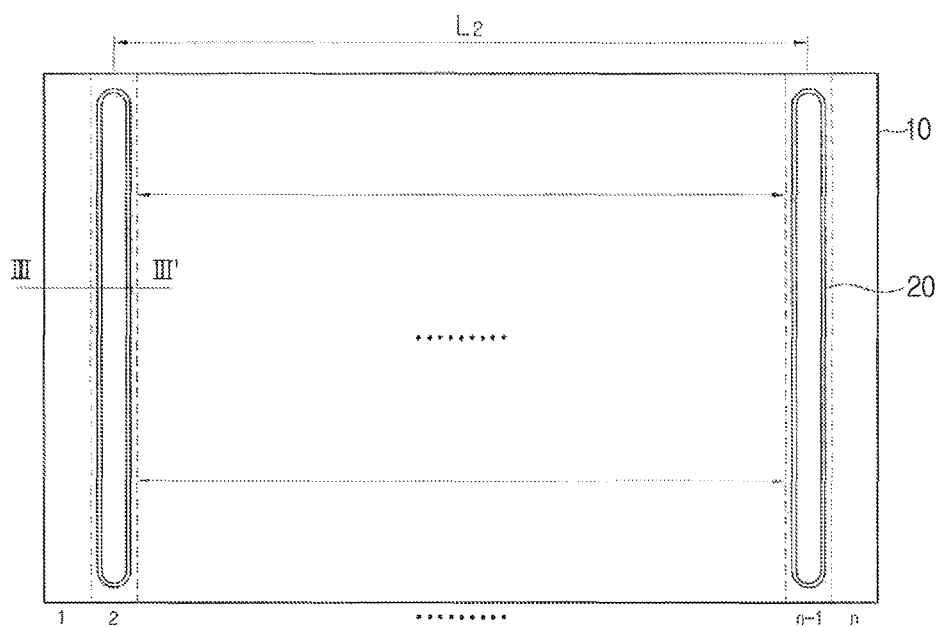

After the original scan region $L_1$ for a certain period of time, as shown in FIG. 8, a magnet scans the altered scan region $L_2$, which is defined from the 2nd part to the (N−1)th part of the sputtering target 10 at least once for a certain period of time.

Figure 9:
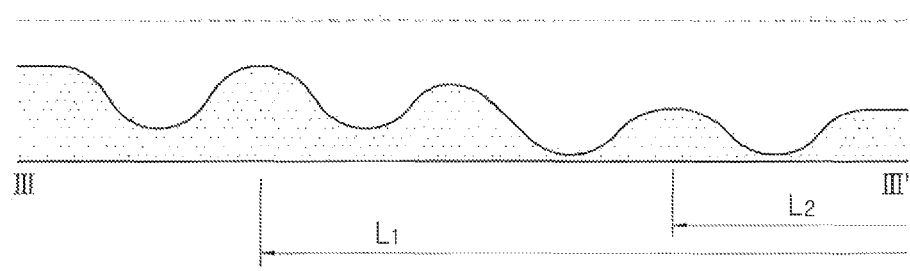

FIG. 9 is a cross-section view along III-III' line of FIG. 6. Referring to FIG. 9, if the altered scan region $L_2$ is scanned for a certain period of time, erosion occurs concentrated on the 2nd part and the (N−1)th part.

Namely, if the width of the sputtering target 10 is examined after scanning separately the original scan region $L_1$ and the altered scan region $L_2$, since the 1st part and the Nth part of the original scan region $L_1$ are not included in the altered scan region $L_2$, additional concentration of erosion rarely occurs on the 1st part and the Nth part of the sputtering target 10 while scanning the altered scan region $L_2$. Therefore, utilization efficiency could be improved by dispersing the parts where erosion is concentrated on throughout the target, compared to a prior method.

Example 2

Assuming that P=2, Q=1, and altered scan region is scanned once, original scan region ($L_1'$ of FIG. 10) is defined such as $L_2$ of FIG. 8, and the altered scan region ($L_2'$ of FIG. 10) is defined such as $L_1$ of FIG. 6 to scan a sputtering target 20.

Figure 10:
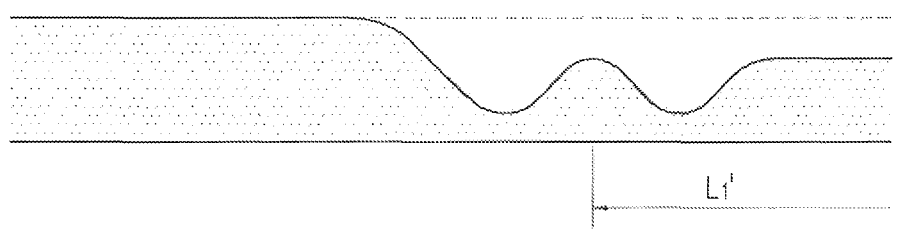
Figure 11:
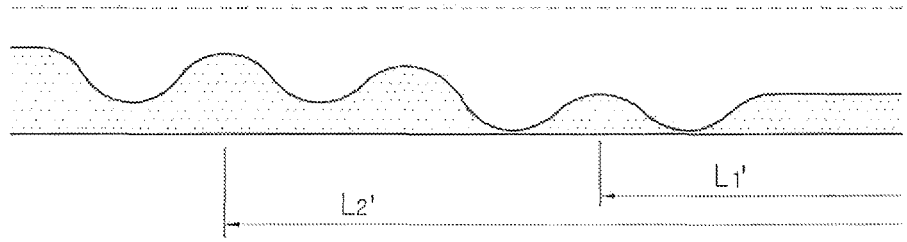

If scanned as such, as shown in FIG. 10, after the original scan region $L_1'$ is scanned for a certain period of time, erosion occurs concentrated on the 2nd part and the (N−1)th part, while after the altered scan region $L_2'$ is scanned, erosion occurs concentrated on the 1st part and the Nth part.

Accordingly, utilization efficiency of the sputtering target could be improved by dispersing the parts where erosion is concentrated on throughout the target likewise in the example recited above, since erosion is to be occurring on the outermost parts after a certain period of time.

Example 3

Assuming that P=1, $Q_1$=2, $Q_2$=3, and altered scan region is scanned twice, original scan region $L_1$ is defined from the 1st part to the Nth part as start part and end part respectively as shown in FIG. 6, and altered scan region $L_2$ is defined from the 2nd part to the (N−1)th part as start part and end part respectively, since $Q_1$=2 as shown in FIG. 8.

Figure 12:
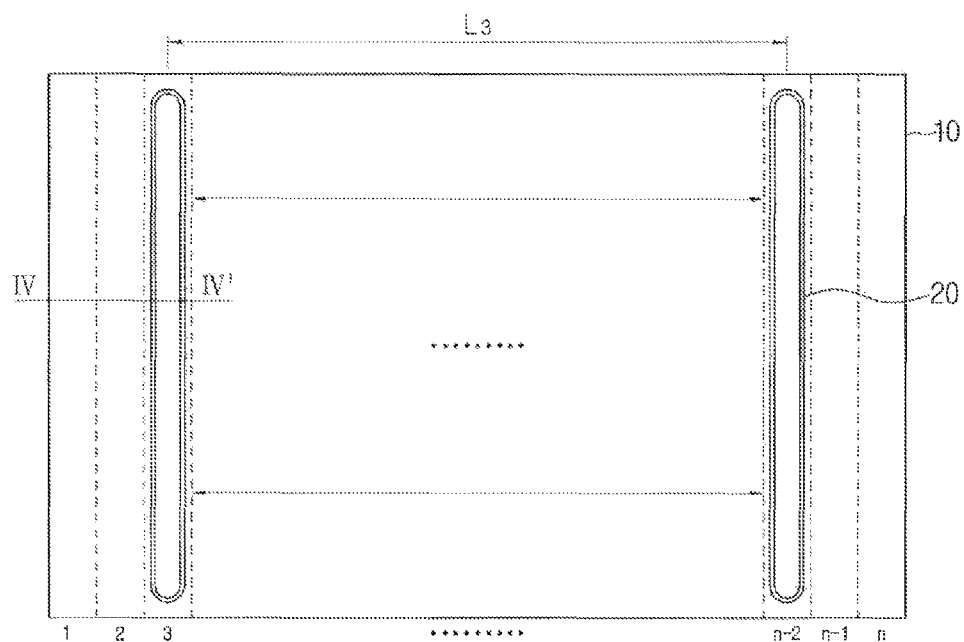

Likewise, altered scan region $L_3$ is defined from the 3rd part to the (N−2)th part as start part and end part respectively, since $Q_2$=3 as shown in FIG. 12.

As in the example 1, the original scan region $L_1$ and the altered scan region $L_2$ are scanned. Thereafter, the other altered scan region $L_3$ is scanned from the 3rd part to the (N−2)th part of a sputtering target 10.

Figure 13:
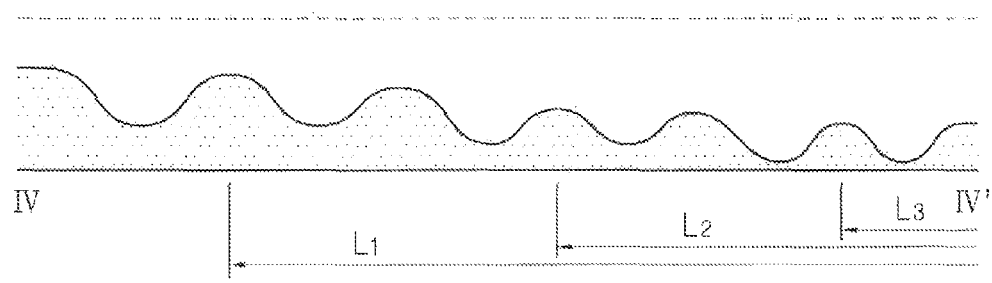

As illustrated in FIG. 13, since the 1st part, the 2nd part, the (N−1)th, and the Nth part of the sputtering target 10 are located on the outer part of the altered scan region $L_3$, additional concentration of erosion rarely occurs.

As well as in the aforementioned example, utilization efficiency of the sputtering target could also be enhanced by dispersing the parts where erosion is concentrated on throughout the target in this exemplary embodiment.

The examples above are stated with the most typical cases, and utilization efficiency of the sputtering target could be increased by scanning the sputtering target in the manner that a number of the altered scan regions are set up as necessary, and each start part of altered scan regions is set up differently from each other.

A sputtering method using a sputtering device according to second exemplary embodiment of the present invention is described in greater detail below.

Figure 14:
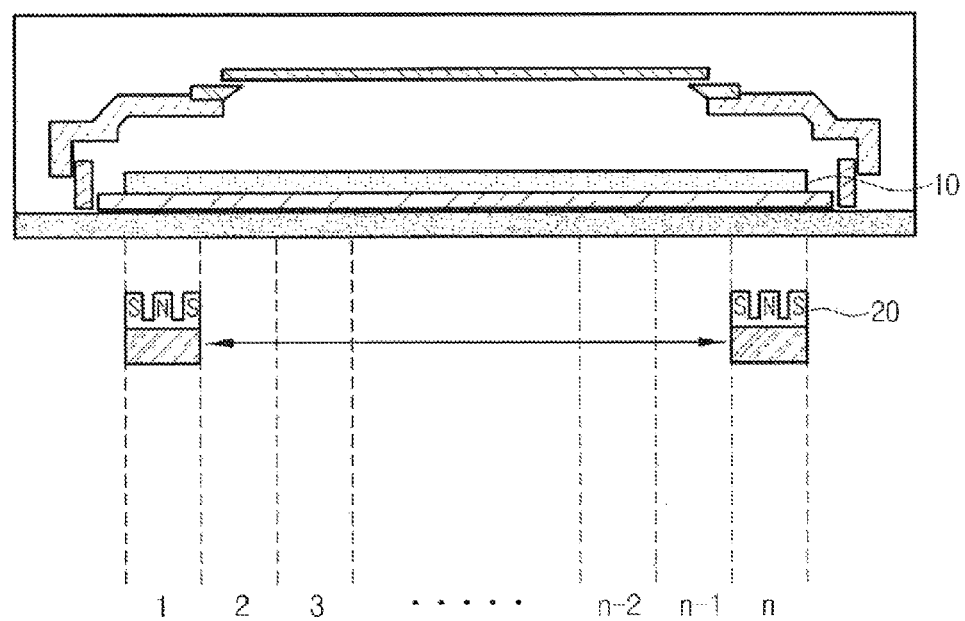
FIG. 14 is an overview of a sputtering device employed in a sputtering method using a sputtering device according to second exemplary embodiment of the invention.

FIG. 14 is a top view of a sputtering device employed in a sputtering method using a sputtering device according to second exemplary embodiment of the invention.

In the second exemplary embodiment as well as in the first exemplary embodiment of the invention, referring to FIG. 14, entire scan region is divided by n parts from left side to right side of the sputtering target, along which a magnet scans back and forth (n is a positive integer).

Although the entire scan region is defined from left side to right side in order to maximize utilization efficiency of the sputtering target 10, some part of the sputtering target 10 may be set up as the entire scan region as necessary. Furthermore, it is preferable that each width of the divided parts is prepared substantially the same as in the examples mentioned above.

In the sputtering method using a sputtering device according to the second exemplary embodiment of the present invention, multiple forward scan region and multiple backward scan region are defined respectively as some part of the divided entire scan region as above.

In addition, scan cycle 1 and scan cycle 2 are arranged by combinations of several multiple forward scan regions and several multiple backward scan regions respectively, and the multiple forward scan regions and the multiple backward scan regions comprised in each scan cycle are alternately arranged.

The multiple forward scan regions are arranged in the scan cycle 1 in the manner that the first forward scan region is defined from the 1st part out of the n parts to the Pth part out of the n parts as start part and end part respectively, and the Ath forward scan region is defined from the Ath part out of the n parts to the (P+A−1)th part out of the n parts as start part and end part respectively, until (P+A), which is end part of the last forward scan region becomes n ($1 \leq A \leq (n/2)$, $((n/2)+1) \leq P < n$, wherein A and P are integers).

The multiple forward scan regions in the scan cycle 2 are arranged in the reverse order to the multiple forward scan regions arranged in the scan cycle 1.

Further, the multiple backward scan regions which are arranged in the scan cycle 1 and the scan cycle 2 are arranged alternating with the multiple forward scan regions, in the manner that end part of the previous forward scan region is set up as start part of the backward scan region, and start part of the subsequent forward scan region is set up as end part of the backward scan region, such that a magnet 10 moves with a continuous motion.

On the other hand, the scan cycle 1 and the scan cycle 2 are alternately arranged at least appearing once respectively, such that the magnet moves with a continuous motion.

Backward scan region after the last forward scan region of a scan cycle is arranged in the manner that end part of the last forward scan region of the scan cycle is set up as start part of the backward scan region, and start part of the first forward scan region of the next scan cycle is set up as end part of the backward scan region, such that scanning continuity of the magnet can be guaranteed.

Figure 15:
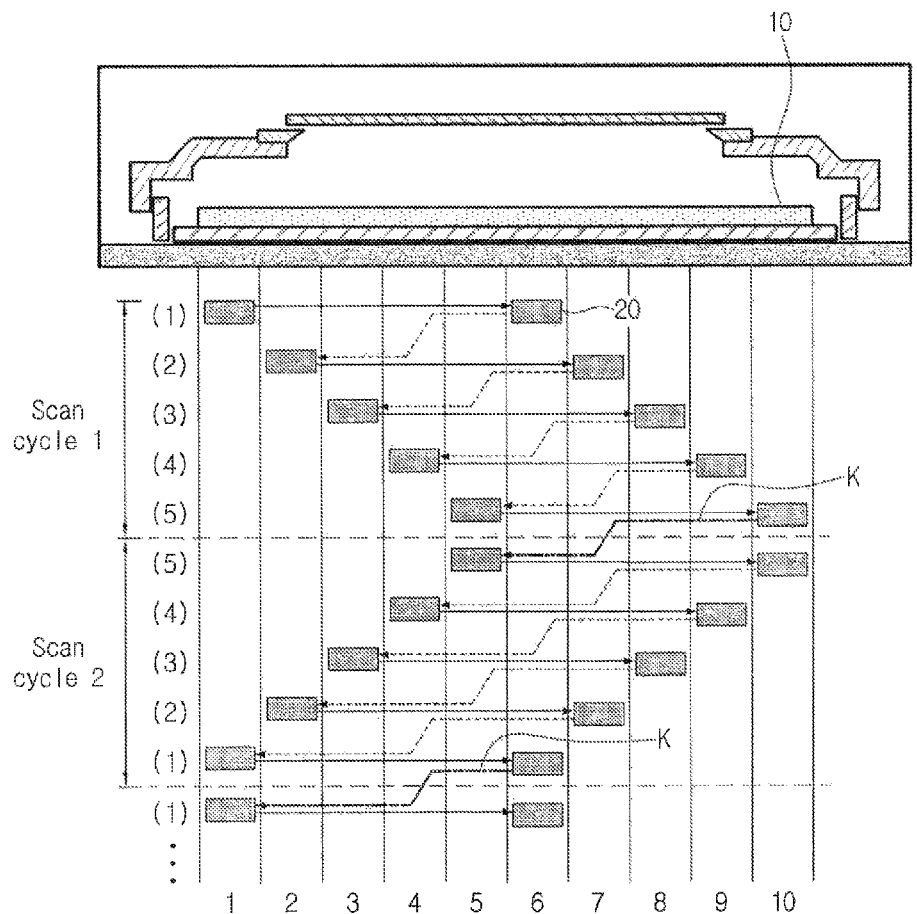
FIG. 15 is an arrangement diagram of a unit scan region according to second exemplary embodiment of the invention.

To be more specific referring to FIG. 15, scan region is divided into 10 parts, and each comprises combinations of several multiple forward scan regions and several multiple backward scan regions, which are properly mixed to be arranged in scan cycle 1 and scan cycle 2.

The 1st forward scan region arranged in the scan cycle 1 is provided in the manner that the 1st part and the 6th part out of the 10 divided parts are defined as start part and end part respectively.

The 2nd forward scan region is provided in the manner that the 2nd part and the 7 (i.e. 6+2−1)th part out of the 10 divided parts are defined as start part and end part respectively. The 3rd forward scan region is provided in the manner that the 3rd part and the 8 (i.e. 6+3−1)th part out of the 10 divided parts are defined as start part and end part respectively.

Forward scan regions are thus sequentially provided in the same manner to the 5th forward scan region, the end part of which is the 10 (i.e. 6+5−1)th part as the scan region is divided into 10 parts.

Moreover, in scan cycle 1, backward scan regions are arranged alternating with the multiple forward scan regions, in the manner that end part of the previous forward scan region is set up as start part, and start part of the subsequent forward scan region is set up as end part, such that scanning continuity of the magnet can be guaranteed.

Forward scan regions in the scan cycle 2 are arranged in the reverse order to those of the scan cycle 1 described above, and backward scan regions in the scan cycle 2 are arranged in the same manner.

On the other hand, scan cycle 1 and scan cycle 2 may be alternately arranged at least appearing once respectively, and when alternately arranged, backward scan region K can be comprised to be arranged between the last forward scan region of the scan cycle 1 and the last forward scan region of the scan cycle 2, thereby achieving continuous scanning of a magnet.

Figure 16:
FIG. 16 is an erosion state diagram of a sputtering target employed according to a sputtering method of the invention.

If the magnet scans along the scan cycle 1 and the scan cycle 2 arranged as above, as shown in FIG. 16, utilization efficiency of the sputtering target can be improved through uniform erosion of a sputtering target in the parts (i.e. start part and end part) where the speed of the magnet decreases.

A sputtering method using a sputtering device according to third exemplary embodiment of the present invention is set forth in detail below.

In a sputtering method using a sputtering device according to third exemplary embodiment of the invention, as in second exemplary embodiment, entire scan region is divided into n parts from left side to right side of the sputtering target, and multiple forward scan regions and multiple backward scan regions are arranged to comprise at least some part of the divided entire scan region.

In addition, scan cycle 1 and scan cycle 2 are arranged by combinations of several multiple forward scan regions and several multiple backward scan regions respectively.

The scan cycle 1 is arranged in the manner that the first forward scan region is defined from the 1st part out of the n parts to the nth part out of the n parts as start part and end part respectively, and the Ath forward scan region is defined from the Ath part out of the n parts to the (n−A+1)th part out of the n parts as start part and end part respectively ($A \leq (n/2)$ if n is an even number, $A \leq (n-1)/2$ if n is an odd number, $1 \leq A \leq (n/2)$, wherein a is an integer).

Multiple forward scan regions in the scan cycle 2 are arranged in the reverse order to the multiple forward scan regions arranged in the scan cycle 1.

Furthermore, multiple backward scan regions arranged in scan cycle 1 and scan cycle 2 are alternately arranged with forward scan regions.

The backward scan regions are arranged in the manner that end part of the previous forward scan region is set up as start part of the backward scan region, and start part of the subsequent forward scan region is set up as end part of the backward scan region, such that scanning continuity of the magnet can be guaranteed.

On the other hand, the scan cycle 1 and the scan cycle 2 are alternately arranged at least appearing once respectively, such that the magnet moves with a continuous motion.

As in second exemplary embodiment, backward scan region after the last forward scan region of a scan cycle is arranged in the manner that end part of the last forward scan region of the scan cycle is set up as start part of the backward scan region, and start part of the first forward scan region of the next scan cycle is set up as end part of the backward scan region, such that scanning continuity of the magnet can be guaranteed.

Figure 17:
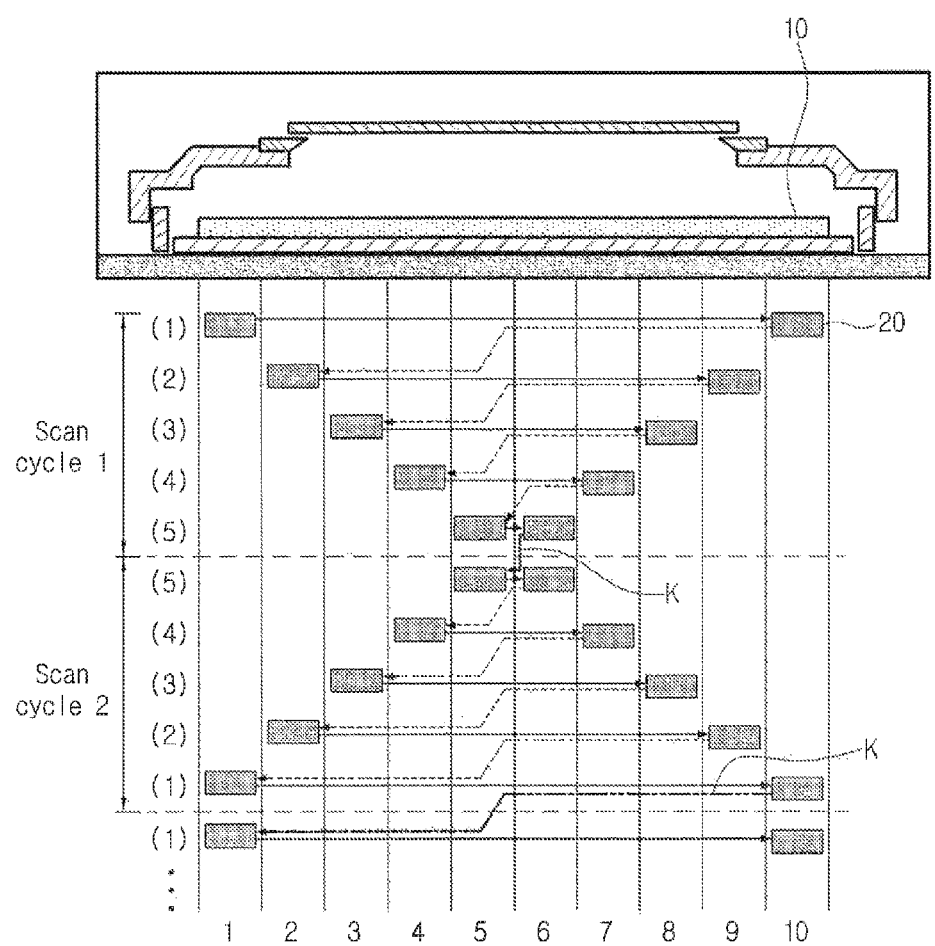
FIG. 17 is an arrangement diagram of a unit scan region according to third exemplary embodiment of the invention.

FIG. 17 is an arrangement diagram of a scan region using the sputtering device according to the third exemplary embodiment of the invention. To be more specific referring to FIG. 17, scan region is divided into 10 parts, and each comprises combinations of several multiple forward scan regions and several multiple backward scan regions, which are properly mixed to be arranged in scan cycle 1 and scan cycle 2.

The 1st forward scan region arranged in the scan cycle 1 is provided in the manner that the 1st part and the 10th part out of the 10 divided parts are defined as start part and end part respectively.

The 2nd forward scan region is provided in the manner that the 2nd part and the 9 (i.e. 10+2−1)th part out of the 10 divided parts are defined as start part and end part respectively. The 3rd forward scan region is provided in the manner that the 3rd part and the 8 (i.e. 10+3−1)th part out of the 10 divided parts are defined as start part and end part respectively.

Forward scan regions are thus sequentially provided in the same manner to the 5th forward scan region, the end part of which is the 5 (i.e. 10/2)th part as the 10 is an even number.

Moreover, in scan cycle 1, backward scan region is arranged alternating with the multiple forward scan regions, in the manner that end part of the previous forward scan region is set up as start part, and start part of the subsequent forward scan region is set up as end part, such that scanning continuity of the magnet can be guaranteed.

Forward scan regions in the scan cycle 2 are arranged in the reverse order to those of the scan cycle 1 described above, and backward scan regions in the scan cycle 2 are arranged in the same manner.

On the other hand, as shown in the second exemplary embodiment, scan cycle 1 and scan cycle 2 may be alternately arranged at least appearing once respectively, and when alternately arranged, backward scan region (k) can be comprised to be arranged between the last forward scan region of the scan cycle 1 and the first forward scan region of the scan cycle 2, thereby achieving continuous scanning of a magnet.

In addition, a sputtering method using a sputtering device according to the modified example of the third exemplary embodiment of the invention is described below. In a sputtering method using a sputtering device according to the modified example of the third exemplary embodiment, when compared to the third exemplary embodiment, entire scan region is divided into odd numbered parts, i.e. N is an odd number.

In the modified example of the third exemplary embodiment, since the entire scan region is divided into odd numbered parts, scan cycle 1 and scan cycle 2 are provided as in the second exemplary embodiment, and the Ath forward scan region is arranged until A becomes $(N-1)/2$. Detailed description of the other features shall be omitted, as they are the same as in the third exemplary embodiment.

Figure 18:
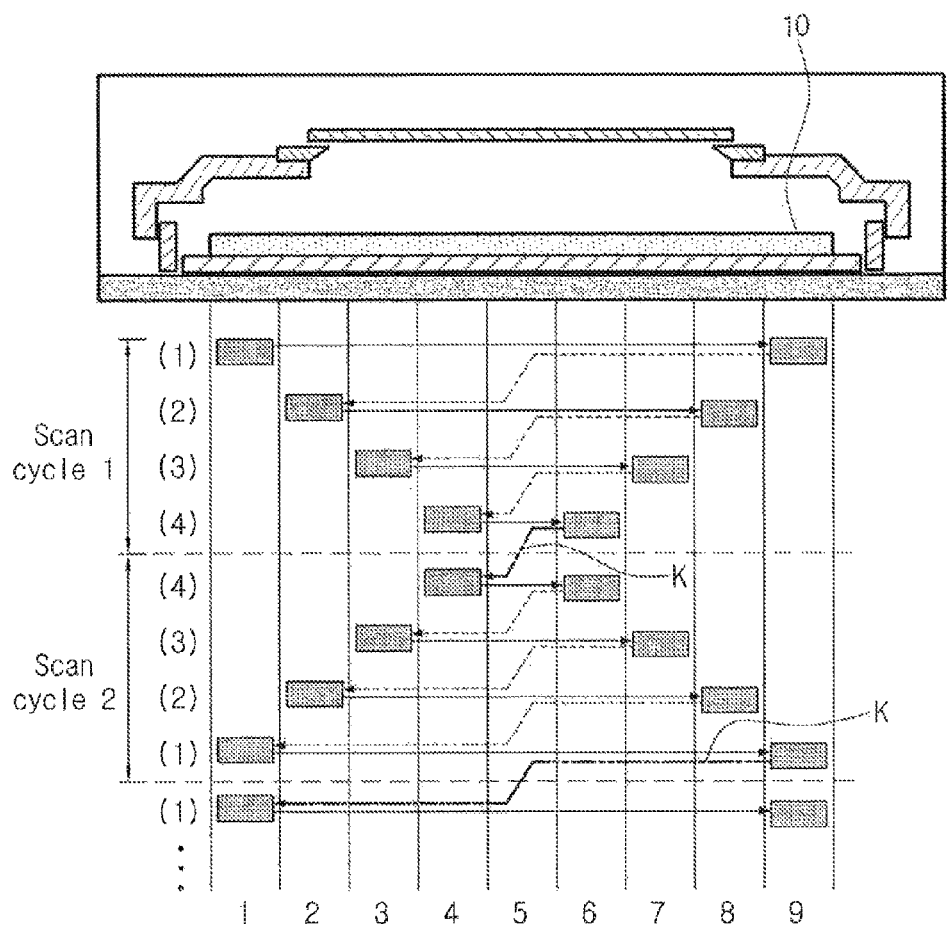
FIG. 18 is an arrangement diagram of a unit scan region according to the modified example of the third exemplary embodiment of the invention.

To be more specific referring to FIG. 18, it is assumed that entire scan region is divided into 9 parts.

Start part of the 4th forward scan region, which is the last forward scan region of scan cycle 1 is set up as the 4th part, which is deduced from $(9-1)/2$, and end part is set up as the 6th part, which is deduced from $(9-4+1)$.

When alternately arranging scan cycle 1 and scan cycle 2, additional backward scan region K can be comprised to be arranged as described in the second exemplary embodiment and the third exemplary embodiment above, such that scanning continuity of a magnet can be guaranteed.

If the aforementioned scan region is set up, and the magnet is to scan along the scan regions, a sputtering target can be uniformly eroded, as a result, utilization efficiency of the sputtering target can be remarkably improved.

In addition, as utilization efficiency of the sputtering target gets better, cost of manufacturing process of sputtering may also be reduced.

While the invention has been illustrated and described with reference to certain exemplary embodiments thereof, it will be understood by those skilled in the art that various changes in form and details may be made therein without departing from the spirit and scope of the invention as defined by the appended claims and their equivalents.

What is claimed is:

1. A sputtering method using a sputtering device, wherein an entire scan region is defined from one side of a sputtering target to the other side, and the sputtering target is scanned by moving a magnet back and forth along the entire scan region multiple times, the method comprising,
   defining the entire scan region, which is divided by N (N is a positive integer) parts;
   defining multiple forward scan regions and multiple backward scan regions, which are arranged to comprise at least some part of the divided entire scan region;
   defining scan cycle 1 and scan cycle 2, which are arranged by combinations of several multiple forward scan regions and several multiple backward scan regions respectively, wherein the scan cycle 1 is arranged in the manner that a first forward scan region is defined from a 1st part out of the N parts to a Pth part out of the N parts as a first start part and a first end part respectively, and an Ath forward scan region is defined from an Ath part out of the N parts to a (P+A−1)th part out of the N parts as an Ath start part and an Ath end part respectively $(1 \leq A \leq (N/2), ((N/2)+1) \leq P < N, (P+A-1) \leq N,$ wherein A and P are integers);
   arranging multiple forward scan regions of the scan cycle 2, in the reverse order to the multiple forward scan regions arranged in the scan cycle 1; and
   defining multiple backward scan regions arranged in the scan cycle 1 and the scan cycle 2 respectively in the manner that a previous forward scan region end part is subsequent backward scan region start part, and a subsequent forward scan region start part is a previous backward scan region end part, such that a magnet moves with a continuous motion, and the scan cycle 1 and the scan cycle 2 are alternately arranged appearing at least once respectively, such that the magnet moves according to the scan cycle 1 and the scan cycle 2.

2. The sputtering method using a sputtering device according to claim 1, wherein when alternately arranging the scan cycle 1 and the scan cycle 2, a backward scan region after a last forward scan region of a scan cycle is arranged in the manner that a last forward scan region end part of the scan cycle is defined as a backward scan region start part, and a first forward scan region start part of a next scan cycle is defined as a backward scan region end part.

3. The sputtering method using a sputtering device according to claim 1, wherein each width of the N parts is substantially the same as each other.

4. The sputtering method using a sputtering device according to claim 1, wherein each width of the N parts is substantially the same as the width of the sputtering target.

5. A sputtering method of using a sputtering device, wherein an entire scan region is defined from one side of a sputtering target to the other side, and the sputtering target is scanned with a magnet moving back and forth along the entire scan region multiple times, the method comprising,
   defining the entire scan region, which is divided by N (N is a positive integer) parts;
   defining multiple forward scan regions and multiple backward scan regions, which are alternately arranged to comprise at least some part of the divided entire scan region;
   defining scan cycle 1 and scan cycle 2, which are arranged by combinations of several multiple forward scan regions and several multiple backward scan regions respectively, wherein the scan cycle 1 is arranged in the manner that a first forward scan region is defined from a 1st part out of the N parts to a Nth part out of the N parts as a first start part and a first end part respectively, and an Ath forward scan region is defined from an Ath part out of the N parts to a (N−A+1)th part out of the N parts as an Ath start part and an Ath end part respectively (A≤(N/2) if N is an even number, A≤(N−1)/2 if N is an odd number, 1≤A≤(N/2), wherein A is an integer);

arranging multiple forward scan regions of the scan cycle 2, in the reverse order to multiple forward scan regions arranged in the scan cycle 1; and defining multiple backward scan regions arranged in the scan cycle 1 and the scan cycle 2 respectively in the manner that a previous forward scan region end part is a subsequent backward scan region start part, and a subsequent forward scan region start part is a previous backward scan region end part, such that a magnet has a continuous motion, and the scan cycle 1 and the scan cycle 2 are alternately arranged appearing at least once respectively, such that the magnet moves according to the scan cycle 1 and the scan cycle 2.

6. The sputtering method using a sputtering device according to claim 5, wherein when alternately arranging the scan cycle 1 and the scan cycle 2, a backward scan region after a last forward scan region of a scan cycle is arranged in the manner that a last forward scam region end part of the scan cycle is defined as a backward scan region start part, and a first forward scan region start part of a next scan cycle is defined as a backward scan region end part.

7. The sputtering method using a sputtering device according to claim 5, wherein each width of the N parts is substantially the same as each other.

8. The sputtering method using a sputtering device according to claim 5, wherein each width of the N parts is substantially the same as the width of the sputtering target.

\* \* \* \* \*